United States Patent [19]

Sturgeon

[11] 4,041,411
[45] Aug. 9, 1977

[54] QUANTIZED AMPLIFIER

[75] Inventor: Clayton L. Sturgeon, Fort Worth, Tex.

[73] Assignee: Ranger Engineering Corporation, Fort Worth, Tex.

[21] Appl. No.: 662,871

[22] Filed: Mar. 1, 1976

Related U.S. Application Data

[63] Continuation-in-part of Ser. No. 508,767, Sept. 24, 1974, abandoned, which is a continuation-in-part of Ser. No. 340,682, March 13, 1973, abandoned.

[51] Int. Cl.² .................................................. H03F 21/00
[52] U.S. Cl. .................................. 330/207 A; 330/13; 330/21; 330/28
[58] Field of Search .................. 330/10, 13, 15, 21, 330/31, 28, 117, 207 A, 207 P; 328/21, 22

[56] References Cited

U.S. PATENT DOCUMENTS

| 3,294,981 | 12/1966 | Bose | 307/290 X |
|---|---|---|---|
| 3,526,846 | 9/1970 | Campbell | 330/207 A |
| 3,585,517 | 6/1971 | Herbert | 330/10 |
| 3,636,380 | 1/1972 | Anderson | 330/13 X |

OTHER PUBLICATIONS

Crowhurst, "The Two State Amplifier," *Radio-Electronics* July 1965, pp. 54–56.

*Primary Examiner*—James B. Mullins
*Attorney, Agent, or Firm*—Richards, Harris & Medlock

[57] ABSTRACT

A direct coupled linear transistorized amplifier in which transistors function as switches rather than as semilinear amplifying devices; this is effected by comparing a negative feedback signal with the input signal and utilizing the sense of the resultant error signal to apply power-supply voltage to the load in the direction which tends to minimize this error signal. In the most preferred embodiment, the output switching is performed in push-pull manner.

17 Claims, 5 Drawing Figures

QUANTIZED AMPLIFIER

This application is a continuation-in-part of U.S. application Ser. No. 508,767, filed Sept. 24, 1974, now abandoned which was a continuation-in-part of U.S. application Ser. No. 340,682, filed Mar. 13, 1973, now abandoned.

The present invention relates to electrical signal translation and more particularly to a novel method of amplification of an input signal.

Amplification by apparatus of the present invention provides an exceptional number of characteristics commonly attributed to an "ideal" amplifying or control device. The invention requires relatively simple, economical circuitry that results in an amplifying device that is of small size, light weight, inherently efficient and capable of delivering high power to a load with improved performance.

It has long been a problem to economically and efficiently provide an amplifier or signal translation apparatus that can deliver relatively high power levels to a loaad and simultaneously retain the desirable characteristics of small size, light weight, high efficiency, low standby power drain, fast response, good load regulation, excellent gain and phase stability, linear phase characteristics, flat gain, relative immunity to ambient and environmental conditions, and high reliability.

Excellent performance is possible with conventional class A, AB, and B linear amplifiers. However, the relatively low efficiences of these devices becomes critical at high power levels where large amounts of power must be dissipated resulting in high operating temperatures. Thus, large heat sinks, fans, and sometimes refrigeration are required, precluding small size and light weight.

Another objection to conventional class A, AB, and B amplifiers is their failure to utilize the maximum current capabilities of the output transistors. These amplifiers normally require high current and voltage operation simultaneously in the output transistors resulting in high heat dissipation in the semiconductor chip. This difficulty has been overcome by operating the transistors as switches such that when the current is large the voltage across the device is small and vice versa. Achievement of practical linear proportional amplification while operating the output transistors as switches has heretofore been accomplished by some types of pulse width modulation, or a combination of pulse width modulation and frequency modulation. While the modulation schemes result in higher efficiency, they generally also result in greater complexity and some degradation of performance due to imperfect modulation and demodulation. Heretofore, the simplest circuitry utilizing switching techniques for linear amplification was the combined pulse width modulation and frequency modulation technique. This technique utilizes a two state switching arrangement whereby the two state switch output is delayed, integrated and fed back. The feedback signal is combined with an input signal and the combination becomes the input to the two state device. The result of this arrangement is a modulator in which the output waveform of the switch contains a characteristic representative of the input signal. The two state output signal is demodulated by low pass filtering. The advantage of this technique is a relatively simply self-modulating device that is efficient and can be operated at high power levels.

A major disadvantage of this method is that it is insensitive to the instantaneous output signal at the load Control is implemented by detecting the average value of the output of the switch and combining it with the input signal. There can be a significant discrepancy between the average value of the switch output and the actual instantaneous output at the load with no resulting correction signal.

If an additional feedback loop from the load is implemented to overcome the problem, it must of necessity be a low pass filter to preserve the fundamental frequency of oscillation and basic philosphy of the device. The response will generally be under damped with large overshoot and associated stability problems compounded by interaction of the lowly damped system oscillations with the modulation frequency. In short, very high performance with respect to small error, fast response and low overshoot is difficult at best and practically impossible with this type device.

The present invention overcomes these shortcomings and surpasses many of the excellent characteristics of conventional amplifiers while preserving the high efficiency of the pulse width modulation and pulse width frequency modulation devices.

Amplification with apparatus of the present invention is accomplished by the following: (1) generating an error signal equal to the difference between the input signal and the instantaneous state of the output signal, (2) determining the polarity of the error signal, (3) applying appropriately one or the other of full positive or negative supply voltages to the load via a smoothing circuit in such a direction as to reduce the error, (4) maintaining the appropriate impressed supply voltage until the polarity of the error signal reverses, (5) changing to the other of the impressed supply voltage accordingly as the polarity of the error signal reverses.

In a preferred embodiment of the invention, the load constitutes an integral part of the smoothing circuit such that changes in the load also result in predetermined changes in the characteristics of the smoothing circuit (called response delay) such as to create advantages of an adaptive nature. The method outlined above makes it possible to bring the output signal into agreement with the input signal in the shortest possible time consistent with the magnitude of the applied voltages and the response delay. In one embodiment of the invention, the response delay circuitry comprises a nondissipative, nonlinear low pass filter placed between the alternating impressed supply voltages and the load.

The operation of apparatus as outlined above insures that an alternating positive and negative error signal will exist for all values of input and output. In general, the oscillating error will not be of constant period since it is determined by an arbitrary input signal and the instantaneous state of the output.

In a preferred embodiment of the invention, the oscillation will be small and the average value of the error signal will be essentially zero.

In accordance with the present invention, an amplifier for coupling first and second energy levels to a load in accordance with an input signal includes means for comparing the instantaneous output signal as developed at the load with an input signal to generate an error signal. The error signal is applied to an amplifier that generates switching signals varying therewith. Switching means responds to the switching signals to couple the first energy level to the load for a first switching signal while maintaining the second energy level disconnected from the load, and for coupling the second energy level to the load for a second switching signal while maintaining the first energy level disconnected from the load.

For a more complete understanding of the present invention and advantages thereof, reference is now made to the following description taken in conjunction with the accompanying drawings.

Referring to the drawings.

Figures 1, 2:
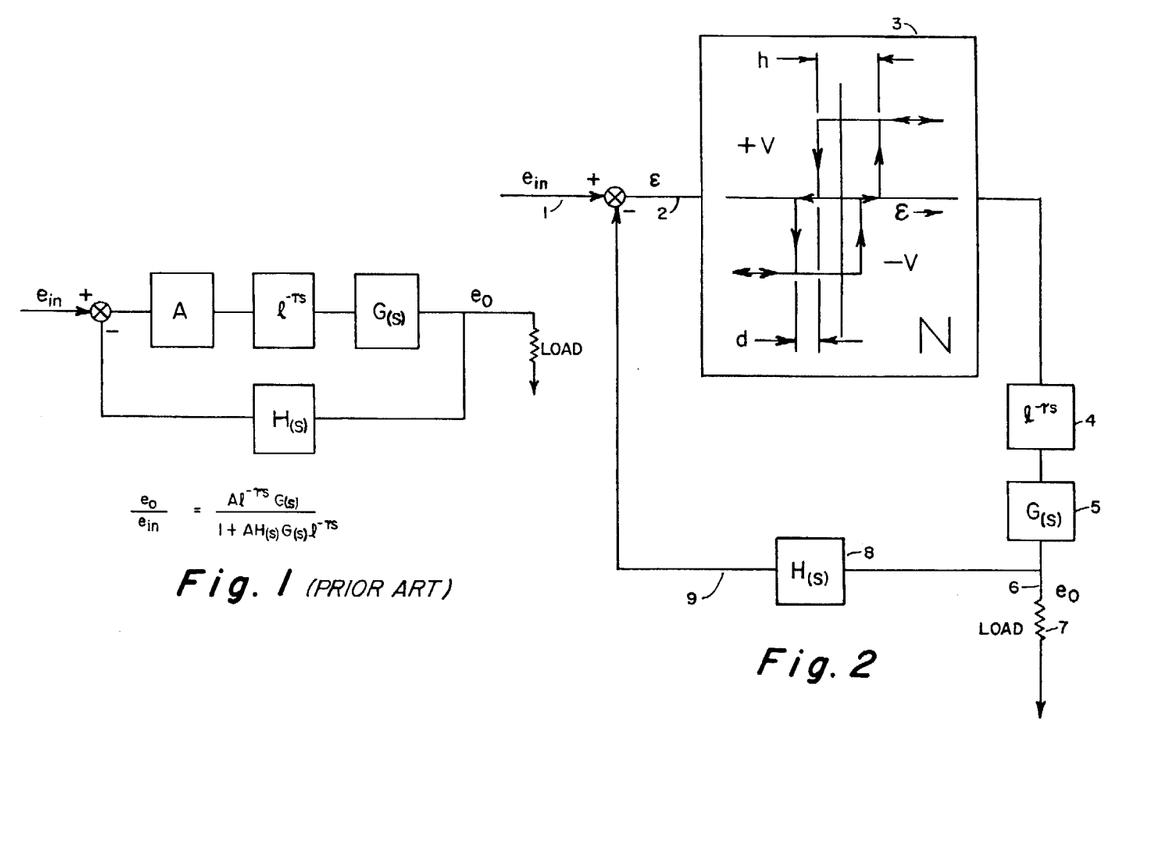
FIG. 1 is a block diagram of a conventional feedback system for providing an output signal to a load in accordance with an error signal resulting from a comparison of a feedback signal with an input signal.
FIG. 2 is a block diagram of an amplifier in accordance with the present invention including a two state network replacing the conventional amplifier of FIG. 1.

To describe the operation of the apparatus of the invention it is necessary to define theory and terms common to linear and nonlinear control system technology. FIG. 1 represents a classical single loop system. The subscript S implies ratios of polynomials in the LaPlace transform operator. Thus $G_{(s)}$ and $H_{(s)}$ are polynomials in S, and A is a frequency invariant gain. The equation reproduced in FIG. 1 defines the closed loop transfer function of the system.

Figure 3:
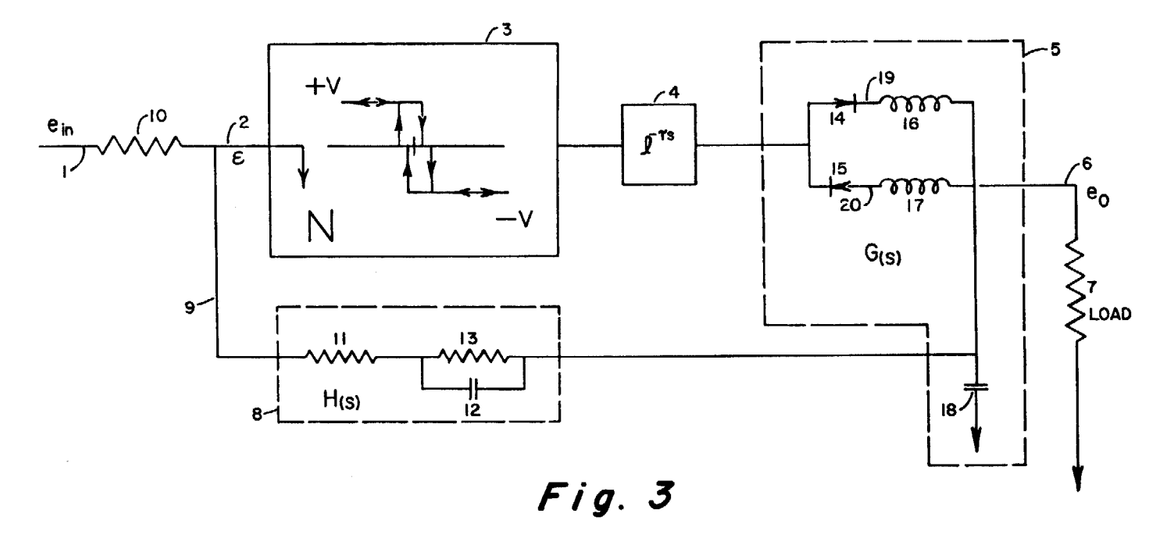
FIG. 3 is a block diagram including a two state device that applies either a positive or a negative voltage to a load through response delay circuitry.

Referring to FIG. 2, there is shown a block diagram of the invention showing the nonlinearity and important characteristics of a two state switch 3. FIG. 3 is a more detailed representation of the actual circuit and will be discussed with FIG. 2.

The nonlinearity of the two state switch 3 in FIGS. 2 and 3 may be represented by an equivalent gain defined by a "dual input describing function". $\epsilon$ is defined as:

$$\epsilon = \epsilon' + r \tag{2}$$

where $\epsilon'$ is the limit cycle amplitude and $r$ is the error signal at the input frequency. The magnitude and frequency of $\epsilon'$ is determined by finding the solution to the characteristic equation for the "autonomous system"

$$1 + e^{-\tau s} G_{(s)} H_{(s)} N' = 0 \tag{2}$$

where N' is the conventional describing function and $e^{-\tau s}$ is the transport delay of the circuit.

The equivalent linear gain for $r < \epsilon'$ is given by $$N = (2V/\pi\epsilon') \tag{3}$$

Thus for small signal errors the invention behaves as a simple linear system shown in FIG. 1. However, if the signal error increases, say due to a sudden change of the input or output to a value greater than $\epsilon'$, the amplifier of the present invention immediately behaves as a switched system. Under these conditions the limit cycle is quenched and full DC voltage is continuously applied in such a manner as to reduce the error. When the error is thus reduced to a value in the neighborhood $\epsilon'$, the limit cycle resumes and the system again behaves in a linear manner. Thus, the invention exhibits "dual mode behavior". Dual mode operation results in excellent transient response, linear phase shift with frequency, and wide system bandwidth. The invention results in an extremely simple dual mode system without the usual stability problems.

Another important advantage of the invention is an automatic adjustment of the equivalent linear forward loop gain as the load changes. Note that the equivalent gain given in equation (3) varies inversely with the limit cycle amplitude $\epsilon'$.

Consider for simplicity that the circuit in FIG. 1 is being used as a DC power supply and considering only a steady state condition. Assume $G_{(s)} = 1 = H_{(s)}$ at zero frequency. The reference input $e_{in}$ is being translated from a low power level to a higher power level, $e_o$, at the unity gain. The equation of FIG. 1 then becomes:

$$e_o/e_{in} = (A/1+A) \tag{4}$$

It is desirable that $e_o$ remain constant for any output power demand. However, the gain A will normally decrease as power demand increases due to nonzero output impedance. Thus, a linear system with a fixed gain will have less than perfect load regulation, and from FIG. 3:

$$G_{(s)} \approx \frac{\omega_n^2}{S^2 + 2\epsilon S\omega_n + \omega_n^2} \tag{5}$$

where:

$$\omega_n = \frac{1}{\sqrt{LC}}$$

$$\epsilon = \frac{1}{2R_L}\sqrt{\frac{L}{C}}$$

If the load is resistive then the damping ratio varies inversely with the load resistance or directly with the power output.

Equation (2) shows that as the load increases, the frequency of oscillation will also increase. Since $G_{(s)}$ is a low pass filter, the resulting magnitude of $\epsilon'$ will be less and from equation (3) the equivalent linear gain will thus increase tending to compensate automatically for any decrease in the forward loop gain. Thus, very low, and if desired, negative output impedances can be realized by the invention.

Another important feature of the invention is that the equivalent forward loop gain adjusts automatically to maintain constant dynamic response by shunting the feedback rather than dividing down the input by a potentiometer. The signal source sees virtually no change in loading as gain is varied. The difficulty encountered heretofore with adjusting gain in this manner has been that the overall closed loop dynamics are dependent upon the total open loop gain and therefore changes.

FIG. 1, as mentioned, is a representation of a conventional feedback system and is used only to point out the similarities and differences of the invention.

FIG. 2 is a representation of the invention showing many similarities to FIG. 1 with the exception of the two state switch 3 which replaces block "A" in FIG. 1. The two state device 3 applies either a +V or -V voltage to the load via circuits 4 and 5 in response to the polarity of the error signal appearing on line 2. Circuit 4 consists of a transport delay means for the circuit and is on the order of $0.1 \times 10^{-6}$ seconds. Circuit 5 is a low pass filter that prevents the output on line six from instantaneously changing from the plus voltage supply to the negative voltage supply, and is hence called "response delay" in the specification. The parameters $d$ and $h$ of the two switch 3 are preferably so small as to have negligible effect on operation of the circuit; however, they may become significant without violating the basic principles of the invention. Circuit 8 is a feedback element that measures the instantaneous state of the output on line 6. Preferably $H_{(s)}$ will possess lead or "prediction" characteristics that help to compensate for the inherent delay of circuit 4.

FIG. 3 is a more detailed representation of the invention showing a particularly advantageous arrangement of $G_{(s)}$ and $H_{(s)}$. FIG. 3 is a model suitable for analysis of the embodiment of FIG. 4 which is a schematic of an amplifier that operates in accordance with the functions outlined with respect to functions of FIG. 3 with the addition of gain circuit 21 suitable for gain adjustment of the amplifier, a discussed previously. Circuit 21, typically, allows linear adjustment of the voltage gain ($e_o/e_{in}$) from 5.17 to 103.4.

All of the transistors, diodes, and resistors with the exception of circuits 8 and 21, resistors 7 and 10, capacitor 18, inductors 40 and 41, and diodes D5 and D6 perform the function of circuit 3 in FIG. 3. Many other embodiments, other than transistorized configurations, may comprise the circuit 3, and such circuits that could will be obvious to anyone skilled in the art. Also, many other circuits are possible to perform the functions of $G_{(s)}$ and $H_{(s)}$ (circuits 5 and 8) and will be obvious to those familiar with the art.

Figure 4:
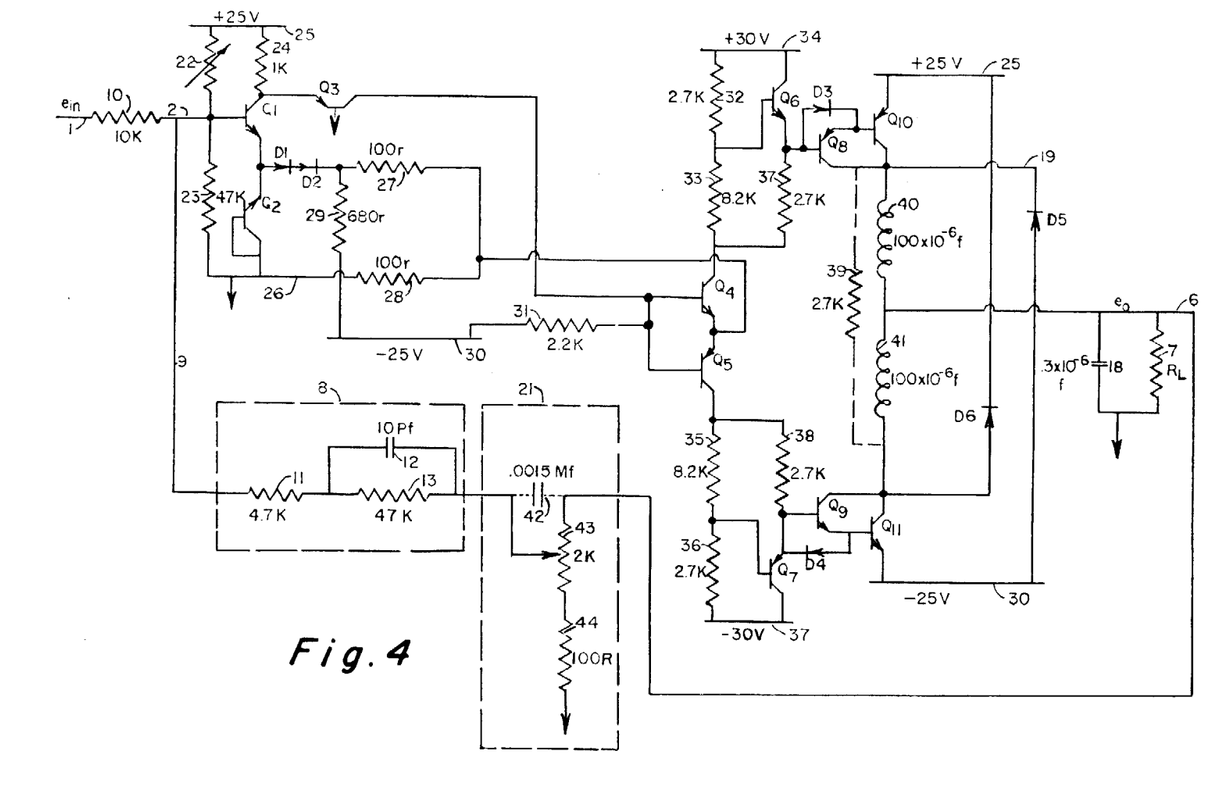
FIG. 4 is a schematic of one embodiment of the two state device of FIG. 3 including a Schmitt trigger driving transistorized switching circuitry.

In FIG. 4, transistor Q2 sets the voltage at the emitter of Q1 below ground by its base to emitter drop. Therefore, the base of Q1 is approximately at ground potential in the unexcited state. Transistors Q1, Q2, Q3, Q4, and Q5 and their associated diodes and resistors comprise a single ended input, double ended output, Schmitt trigger that has very low dead space and hysteresis. A positive feedback connection is connected from the emitters of transistors Q4 and Q5 to the emitters of transistors Q1 and Q2 via resistors 27 and biasing diodes D1 and D2. Resistor 28 shunts part of the positive feedback signal resulting in a lowered hysteresis characteristic. Diodes D1 and D2 are used to generate a bias voltage drop such that transistor Q3 does not saturate.

When the voltage on line 2 rises slightly above ground transistor Q1 saturates, transistor Q3 turns off, transistor Q4 turns off, transistor Q5 turns on, transistor Q7 turns off, transistor Q9 turns on and transistor Q11 turns on, thereby connecting the negative supply at the line 30 to the load via the response delay circuit comprising an inductor 41. Simultaneously transistor Q6 turns on, turning transistor Q8 and transistor Q10 off, and thereby disconnecting the positive supply at the line 25 from the response delay circuit comprising an inductor 40. Exactly the converse happens when the voltage on line 2 falls slightly below ground.

As a modification of the amplifier of FIG. 4, the inductors 40 and 41 may be replaced by a single inductance connected to the interconnection of the collector electrodes of transistors Q10 and Q11, with the single inductor placed between the collectors and the load. However, using two inductors as the response delay means has the advantage of precluding large short duration currents flowing from the positive supply through transistors Q10 and Q11 to the negative supply in the event that one transistor does not shut off before the opposing transistor turns on. This undesirable effect is also reduced by the interconnection of transistors Q4 and Q5 in that transistor Q4 must turn off before transistor Q5 can turn on and vice versa.

Another advantage of using two inductors is an improvement in transient response since the effective response delay is nonlinear with this arrangement. Consider FIGS. 3 and 4; assume that the input is a square wave such that the output is negative at the time of observation. Inductor 41 will be conducting the load current and energy will be stored in its magnetic field. Assume now that the input suddenly changes to an equal value of opposite polarity. The circuit will effectively see inductors 40 and 41 in parallel until all the energy previously stored in the magnetic field of inductor 41 is transferred to the positive supply. At that instant the circuit sees a single inductor and the rate of change of the output is slowed. The net result is a very rapid initial rate of change of the output and then a decrease in the rate of change which reduces overshoot to essentially zero, assuming a properly designed feedback circuit 8.

The feedback circuit 8, consisting of resistor 11, capacitor 10, and resistor 47, is important with regard to improved performance of the invention. It comprises a lead-lag network that affects the limit cycle frequency. Simultaneously it determines the gain and phase relationship between the output and input when operating in the linear mode, and it determines the switching characteristic when operating in the switching mode. Design techniques for optimization of response for a particular application will be obvious to anyone skilled in linear and nonlinear control system theory.

A parts list for the circuit of FIG. 4 is as follows:
Transistors Q1, Q2, Q4, Q6 — 2N4124
Transistors Q3, Q5, Q7 — 2N4126
Diodes D1, D2 — Sbould have approximately 0.6 volt forward drop at 50 ma. (not critical)
Diodes D3, D4 — 1N34, or 1N60 etc.
Diodes D5, D6 — MR 850
Transistor Q8 — 2N2907A
Transistor Q9 — ECG-210
Transistor Q10 — MJE 234
Transistor Q11 — MJE 224

In an operating model of the circuit of FIG. 4, the following results were achieved:
The limit cycle frequency is approximately 450 KHz.
The bandwidth is approximately 0 to 150 KHz.
The gain is flat throughout the bandwidth.
The efficiency at half power is 87%.
The phase shift is linear with frequency and is approximately 6° at 20 KHz.
The circuit will deliver 96 watts continuous.
The circuit has been operated for short times at 192 watts.
The square wave transient response for ±10 volt output:
Rise time: $5 \times 10^{-6}$ sec (4 volts per $10^{-6}$ sec)
Overshoot: Zero
Very low drift with temperature.

Figure 5:
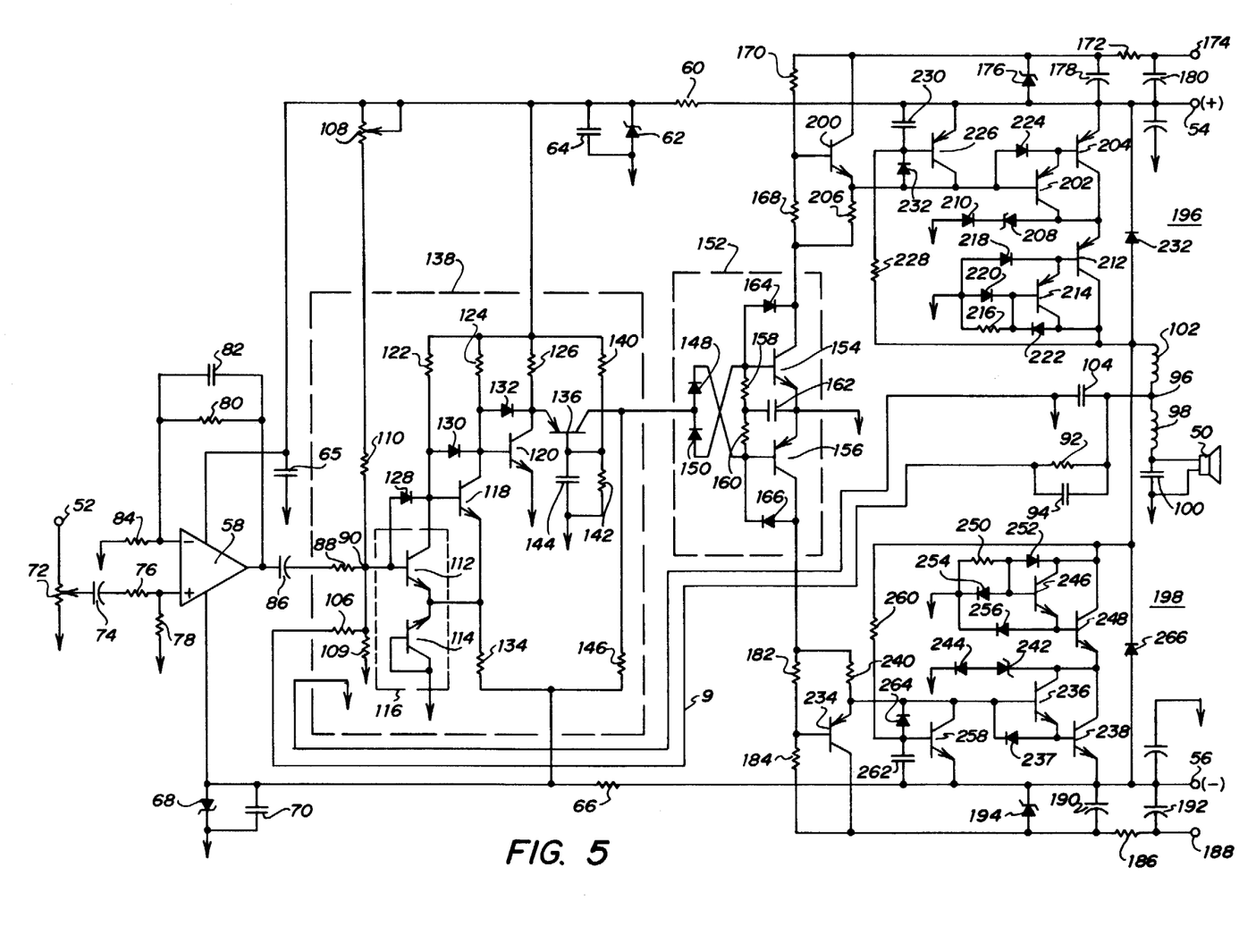
FIG. 5 is an alternate embodiment of the two state device of FIG. 3 wherein a Schmitt trigger drives two channels for coupling separate energy levels to a load.

Referring to FIG. 5, there is shown an alternate embodiment of a system in accordance with the present invention including the two state device 3 and the circuits 4, 5 and 8 of FIG. 3. The embodiment shown is for driving a speaker load 50 from an audio input signal applied to a terminal 52. The speaker load 50 is driven from a positive energy level applied to a terminal 54 and a negative energy level applied to a terminal 56. The positive and negative energy levels at the terminals 54 and 56, respectively, are provided from a power supply (not shown), and in addition to driving the speaker load 50, also provide driving voltages to other components of the circuit including an operational amplifier 58. The positive voltage of the energy level applied to the terminal 54 is reduced through a dropping resistor 60 then regulated by a Zener diode 62 in parallel with a filter capacitor 64. Similarly, the negative voltage of the energy level applied to the terminal 56 is stepped down through a resistor 66 and regulated by a Zener diode 68 in parallel with a filter capacitor 70.

An input signal applied to the terminal 52 is connected to the noninverting input of the operational amplifier 58 through a potentiometer 72 having a wiper arm connected to a capacitor 74 in series with a resistor 76 of a biasing network including a resistor 78 connected to ground. A feedback loop for the operational amplifier 58 includes a resistor 80 in parallel with a capacitor 82 connected to the inverting input terminal of the amplifier which also is grounded through a biasing resistor 84. An output from the operational amplifier 58 is coupled through a capacitor 86 and a resistor 88 through a summing junction 90.

Also coupled to the summing junction 90 is a negative feedback signal on line 9 generated at the output of the circuit 8 comprising in FIG. 5 a resistor 92 in parallel with a capacitor 94. The interconnection of the resistor 92 with the capacitor 94 is tied to a terminal 96 and responds to the instantaneous state of an output signal applied to the speaker load 50. The terminal 96 is also connected to an inductor 98 in series with a capacitor 100 that parallels the speaker load 50. The components 98 and 100 comprise optional filtering to minimize the limit cycle. The instantaneous output voltage at the terminal 96 is generated at the output of circuit 5, FIG. 3, comprising in FIG. 5, an inductor 102. Also tied to the terminal 96 is a filtering capacitor 104 connected to ground.

A feedback signal on the line 9 is coupled to the summing junction 90 through a feedback resistor 106 and is compared at the junction 90 with the output of the operational amplifier 58. The difference is an error signal having a polarity reflecting the instantaneous state of the output signal at the terminal 96. To adjust the voltage at the terminal 90 to a zero error signal for a zero output signal from the amplifier 58, a potentiometer 108 in series with resistor 109 and 110 are connected to the terminal 90.

Primarily, the amplifier of the present invention provides current gain from the summing junction 90 to the terminal 96. Voltage gain to the circuit of FIG. 5 is provided by the operational amplifier 58, typically set at a value of 6, and the values of the resistor 88, 106 and 92. Typically, the gain established by the resistors 88, 106 and 92 is approximately 5 resulting in a total voltage gain of 30 between the terminal 52 and terminal 96.

An error signal generated at the summing junction 90 by comparing the output voltage from the operational amplifier 58 with a negative feedback voltage is applied to a Schmitt trigger 138 at the base electrode of a transistor 112 of a complementary transistor pair including a transistor 114 matched for operational characteristics. The transistors 112 and 114 are available as a single unit 116.

Following the transistor 112 are two additional stages of amplification provided by transistor 118 and 120. The effect is to provide at the collector electrode of the transistor 120 switching signals varying in accordance with the error signal generated at the summing junction 90.

Each of the transistors 112, 118 and 120 is biased by the regulated positive voltage at the Zener diode 62 through respective resistors 122, 124 and 126. The collector base junction of each of the transistors is shunted with a diode 128, 130 and 132, respectively. The emitter electrodes of the transistors 112, 114 and 118 are interconnected through a resistor 134 to a regulated negative voltage at the Zener diode 68.

A singe ended output voltage at the collector electrode of the transistor 120 is coupled to a common base amplifier including a transistor 136. The common base amplifier matches the impedance of the Schmitt trigger 138 to the remainder of the circuit. A bias voltage for the transistor 136 is established by a divider network consisting of a resistor 140 in series with a resistor 142, the latter parallel to a capacitor 144. The collector electrode of the transistor 136 is biased through a resistor 146 to the negative voltage at the Zener diode 68.

A switching signal output from the common base amplifier generated at the collector electrode of the transistor 136 is coupled to steering diodes 148 and 150 of a timing and level shifting network 152. Depending on the polarity of the switching signal from the Schmitt trigger 138, a voltage is applied to either the base electrode of a transistor 154 or the base electrode of a transistor 156. Interconnected between the base electrodes of the transistors 154 and 156 is a timing circuit comprising a T-filter consisting of resistors 158 and 160, and capacitor 162, the latter connected to ground along with a common interconnection of the emitter electrodes of the transistors 154 and 156.

The collector base junctions of the transistors 154 and 156 are shunted by diodes 164 and 166, respectively. The transistor 154 is connected at the collector electrode to a divider network consisting of a load resistor 168 is series with a resistor 170, the latter in series with a resistor 172 connected to a positive voltage supply at a terminal 174. The voltage at the interconnection of the resistors 170 and 172 is regulated by a Zener diode 176 with supply filtering provided by capacitors 178 and 180 as connected to the resistor 172. Similarly, the collector electode of the transistor 156 is connected to a divider network of a load resistor 182 in series with a resistor 184, the latter connected to a filter including a resistor 186 tied to a negative voltage supply at a terminal 188. The filter also includes capacitors 190 and 192 with a Zener diode 194 providing voltage regulation.

In operation of the timing and level shifting circuit, assume a positive switching signal at the collector electrode of the transistor 136 which is transmitted through the diode 148 to the base electrode of the transistor 156 and through the T-filter to the base electrode of the transistor 154. First, the transistor 156 is turned off and after a time delay, as determined by the resistors 158 and 160, and the capacitor 162, the transistor 154 turns on. This effectively grounds the collector electrode of the transistor 152 and the voltage at the load resistor 168 drops to a level determined by the value of this resistor.

When a switching signal having a negative polarity is generated at the collector electrode of the transistor 136 a voltage is applied through the diode 150 to the base electrode of the transistor 154 and through the T-filter to the base electrode of the transistor 156. First, the transistor 154 turns off and after the time delay as established by the T-filter, the transistor 156 subsequently turns on. This effectively ground the collector electrode of the transistor 156 and the voltage 182 drops to a level determined by the value of this resistor.

Thus, depending on the polarity of the switching signals at the output of a Schmitt trigger 138, either the transistor 154 or the transistor 156 will be conducting, but only after the opposite transistor of this pair is turned off. This is the timing function of the circuit 152 to insure that the load 50 will be connected only to one or the other of the energy levels at the terminals 54 and 56. In addition, the circuit 152 changes the level of the switching signal at the transistor 136 to a higher voltage level as generated at the load resistor of either the transistor 154 or the transistor 156.

The high level switching signals generated at the load resistors of the transistors 154 and 156 are respectively applied to switching circuits 196 and 198, where the circuit 196 controls the coupling of the positive energy level at the terminal 54 to the load 50 and the switching circuit 198 controls the coupling of the negative energy level at the terminal 56 to the load. Note, that since the transistors 154 and 156 are never conducting at the same time, either the positive energy level at the terminal 54 or the negative energy level at the terminal 56 is coupled to the load 50, but never both simultaneously.

During the conduction state of transistor 154, the voltage generated at the interconnection of the resistors 168 and 170 turns off a transistors 200 which is connected in an emitter follower configuration to a Darlington pair comprising transistors 202 and 204 which are now turned on. The emitter of the transistor 200 is connected to a resistor 206 in parallel with the resistor 168 to establish the voltage level for turning off the transistor 200. Both the transistors 202 and 204 are interconnected at collector electrodes to a Zener diode 208 in series with a diode 210.

Conduction of the Darlington pair transistors 202 and 204 couples the positive energy level at the terminal 54 to the emitter electrode of a transistor 212 as part of a second Darlington pair including a transistor 214. As the emitter electrode of the transistor 212 increases due to the turn on of the transistor 204, current is caused to flow through the base emitter junction of the transistor 212 which in turn causes a current flow through the base emitter junction of the transistor 214 to ground through a resistor 216.

To maintain the transistor 212 in a turned off condition for a possible current leakage through the transistor 214, a diode 218 is connected between the base electrode of the transistor 212 and ground. A diode 220, connected to the base of transistor 214, provides a conduction path to speed the turn off of the second Darlington pair. Also connected to the transistor 214 is a diode 22 that controls the operation of this transistor to near saturation. A diode 224, connected to the transistor 204, provides a current path to the base of this transistor.

Summarizing the operation of the switching circuit 196, turning off the transistor 200 causes conduction through the transistors 202 and 204 which in turn turns on the transistors 212 and 214. This couples the positive energy level at the terminal 54 to the load (consisting of the speaker load 50, the capacitor 100 and the inductor 98) through the inductor 102 thereby establishing an energizing path that will be maintained so long as the transistor 154 is conducting.

Also included as a part of the switching circuit 196 is an excess current detector comprising a transistor 226 with a base electrode tied through a resistor 228 to the collector electrodes of the transistors 212 and 214. The base drive circuit for the transistor 226 is established at a capacitor 230 and a diode 232.

In operation of this circuit, if the load 50 is drawing an excess amount of current, more than can be supplied by the source connected to the terminal 54, then the transistors 202 and 204 will begin to become out of saturation, thereby causing an increase in potential between the collector electrode of the transistor 212 and the emitter electrode of the transistor 204. This increase in voltage is sensed by the transistor 226 by means of resistor 228 and after a time delay determined by the time constant of resistor 228 and capacitor 230 conducts, thereby shunting the base drive to the transistor 202. This turns off both the transistors 202 and 204 and in turn the transistors 212 and 214 resulting in the disconnection of the positive energy level from the load 50. The transistor 226 will remain in a conduction state until the transistor 154 is turned off, thereby deenergizing the switching circuit 196 and recharging capacitor 230 to turn off the transistor 226.

For purposes of this description, however, assume that when the transistor 154 is turned on the switching circuit 196 applies a positive energy level from the terminal 54 to the load 50. This condition continues until the feedback signal generated on the line 9 changes the polarity of the error signal at the summing junction 90. This in turn changes the polarlity of the switching signal at the collector electrode of the transistor 136 which is coupled through the diode 150 directly to the base electrode of the transistor 154 and through the T-filter to the base electrode of the transistor 156. As explained, the transistor 154 turns off, thereby disconnecting the energy level at the terminal 54 from the load 50 and maintaining this disconnection so long as the base drive is of a polarity to cause transistor 154 to be turned off.

This turn off voltage for the transistor 154, after the time delay determined by the T-filter, now turns on the transistor 156 to couple the negative energy level at the terminal 56 to the load 50 through the switching circuit 198 which is similar to the switching network 196, but with complementary transistors in the Darlington pairs. Thus, conduction of the transistor 156 effectively ground the collector electrode to provide a voltage that will turn off a transistor 234 that turns on a Darlington pair consisting of transistor 236 and 238. The voltage level for turning off the transistor 234 is established by a resistor 240 in parallel with the resistor 182.

The interconnected collector electrodes of the transistors 236 and 238 are tied to a Zener diode 242 in series with a diode 244, the latter connected to ground. Turning on the transistors 236 and 238 connects the negative energy level at the terminal 56 through the collector emitter junction of the transistor 238 to the emitter electrode of a second Darlington pair consisting of transistors 246 and 248. These transistors turn on in the same manner as described previously with regard to transistors 212 and 214. Current flow for turning on the transistors 246 and 248 is established through a resistor 250 connected to ground.

To maintain the transistor 248 in a turned off condition for a possible current leakage through the transistor 246, a diode 256 is connected between the base electrode of the transistor 248 and ground. A diode 254, connected to the base of transistors 246, provides a conduction path to speed the turn off of the second Darlington pair. Also connected to the transistors 246 is a diode 252 that controls the operation of this transistor to near saturation. A diode 237, connected to the transistor 238, provides a current path to the base of this transistor.

Conduction of the transistors 238 and 248 applies the negative energy level at the terminal 56 to the load (consisting of the speaker load 50, inductor 98 and capacitor 100) through the inductor 102, as exaplained with reference to the switching circuit 196.

Also provided in the switching circuit 198 is an excess current detector consisting of a transistor 258 with a base drive established by a resistor 260. Shunting the collector base junction of the transistor 258 is a diode 264. To protect transistors of the switching circuit 198 from a reverse polarity discharge from the inductor 102, a diode 266 shunts the transistors 238 and 148. Operationally, the switching circuit 198 is similar to the switching circuit 196.

Summarizing the operation of the circuit of FIG. 5, an error signal generated by comparing the output of the operational amplifier 58 with a feedback signal on line 9 causes either the transistor 154 or the transistor 156 to turn on. However, prior to the turn on of either of these transistors, the other is turned off. Turning off the transistors 154 or 156 causes the respective switching circuit 196 or 198 to be turned off thereby disconnecting the energy source to the load 50. This operation takes place prior to the coupling of the second energy source to the load through the opposite now conducting switching circuit. Thus, at any one time an energy source at one level is coupled to the load 50 while the energy source of a second level is disconnected from the load. This condition is maintained until the switching circuits 196 and 198 reverse conducting states. Then the opposite energy level is applied to the load 50 and the first energy level is disconnected therefrom.

While several embodiments of the invention, together with modifications thereof, have been described in detail herein and shown in the accompanying drawings, it will be evident that various further modifications are possible without departing from the scope of the invention.

What is claimed is:

1. An amplifier for coupling first and second energy sources to a load in accordance with an input signal, comprising:
   means for comparing only an instantaneous signal as developed at the load and having a value proportional to an input signal with the input signal to generate an error signal,
   feedback means connected between the load and said means for comparing for reproducing the signal as developed at the load at the means for comparing,
   amplifier means responsive only to said error signal and generating control signals varying therewith, and
   switching means responsive to said control signals to couple and maintain the first energy source to the load in response to the polarity of the control signal while maintaining the second energy source disconnected from the load, and for coupling and maintaining the second energy source to the load in response to a reversal of polarity of the control signal while maintaining the first energy source disconnected from the load.

2. An amplifier as set forth in claim 1 wherein said amplifier means comprises a Schmitt trigger generating positive and negative polarity control signals.

3. An amplifier as set forth in claim 2 wherein said switching means includes first means responsive to the positive polarity control signal to couple and maintain the first energy source to the load and second means responsive to the positive polarity control signal to maintain the second energy source disconnected from the load, and wherein the second means responds to the negative polarity control signal to couple and maintain the second energy source to the load and said first means responds to the negative polarity control signal to maintain the second energy source disconnected from the load.

4. An amplifier as set forth in claim 3 including time delay means interconnected between said first means and said second means to introduce a time delay between when one of said means responds to a control signal and the other of said means responds to the same signal.

5. An amplifier as set forth in claim 1 wherein said amplifier means includes a trigger circuit responsive to a single ended error signal and generating first and second control signals.

6. An amplifier as set forth in claim 1 including response delay means connected between said switching means and the load, and the output signal is developed at the interconnection between said delay means and the load.

7. An amplifier as set forth in claim 6 wherein said delay means comprises a nondissipative, nonlinear filter.

8. An amplifier as set forth in claim 6 including a feedback circuit connected at the interconnection of the delay means and the load to said comparing means.

9. An amplifier for coupling first and second voltages to a load in accordance with an input signal, comprising:
   means for comparing only the instantaneous output signal as developed at the load and having a value proportional to an input signal with the input signal to generate positive and negative varying error signals,
   feedback means connected between the load and said means for comparing for reproducing the output signal as developed at the load at the means for comparing,
   first circuit means responsive only to the positive varying error signal and generating a first control signal varying therewith,
   second circuit means responsive only to the negative varying error signal and generating a second control signal varying therewith,
   first switching means responsive to the first control signal to couple and maintain the first voltage to the load, and
   second switching means responsive to the second control signal to couple and maintain the second voltage to the load.

10. An amplifier as set forth in claim 9 including response delay means connected between said first and second switching means and the load, and said output signal is developed at the interconnection of said delay means to the load.

11. An amplifier as set forth in claim 10 wherein said delay means comprises a nondissipative, nonlinear filter.

12. An amplifier as set forth in claim 9 wherein said first switching means and said second switching means each includes an excess current detector responsive to load current for disconnecting the respective voltage level from the load at a preset current level.

13. An amplifier for coupling a positive DC supply and a negative DC supply to a load in accordance with an input signal, comprising:
   response delay means connected operatively in series with the load,
   means for comparing only the instantaneous output signal as developed at the load and having a value proportional to an input signal with the input signal and generating an error signal, and
   a transistorized two state circuit responsive only to the polarity of the error signal for completing and maintaining an interconnection between one of the DC sources and said response delay means and for maintaining an open connection between the other of the DC sources and said response delay means until the polarity of the error signal reverses and interchanging said interconnection between the DC sources and said response delay means in response to a reversal of error signal polarity.

14. An amplifier as set forth in claim 13 wherein said two state circuit includes a Schmitt trigger responsive to the error signal and generating positive and negative switching signals to establish the interconnection between the DC sources and said response delay means.

15. An amplifier as set forth in claim 13 including a feedback circuit connected at the interconnection of said response delay means and the load to said means for comparing.

16. An amplifier as set forth in claim 15 wherein said feedback circuit includes gain adjustment means for varying the amplifier gain.

17. The method of linearly amplifying an arbitrary electrical input signal which comprises:
   a. providing a single feedback signal as subsequently described,
   b. determining that said feedback signal is one or the other of either greater or lesser magnitude than said input signal,
   c. generating as a result of said determination a control signal,
   d. determining the polarity of said control signal,
   e. providing a first source of direct current electrical potential,
   f. providing a second source of direct current electrical potential of lower potential than said first source,
   g. providing a response delay operatively in series with an output means,
   h. in response to only said control signal, disconnecting said second source from said response delay and simultaneously connecting said first source to said response delay when said control signal polarity is negative, and maintaining said connection during such period of negativity.
   i. in response to only said control signal, disconnecting said first source from said response delay and simultaneously connecting said second source to said response delay when said control signal polarity is positive, and maintaining said connection during such period of positivity, and
   j. continuously measuring, as said feedback signal, a parameter representative of the instantaneous state of an output signal as developed at said output means.

* * * * *